United States Patent [19]

Sasaki et al.

[11] Patent Number: 4,626,911
[45] Date of Patent: Dec. 2, 1986

[54] DIGITAL DATA RECOVERY CIRCUIT

[75] Inventors: Takayuki Sasaki, Kanagawa; Eiichi Ichimura, Saitama, both of Japan

[73] Assignee: Sony Corporation, Tokyo, Japan

[21] Appl. No.: 601,675

[22] Filed: Apr. 18, 1984

[30] Foreign Application Priority Data

Apr. 21, 1983 [JP] Japan ............................ 58-59564[U]

[51] Int. Cl.⁴ .......................... H04N 7/04; H04N 5/04
[52] U.S. Cl. ................................. 358/141; 358/148; 358/158
[58] Field of Search ................... 375/97, 83, 119, 120; 358/158, 141, 142, 148, 320, 323, 337, 339, 12, 15; 360/36.1, 36.2; 329/50, 124

[56] References Cited

U.S. PATENT DOCUMENTS 4,015,288  3/1977  Ebihara et al. ...................... 358/320
4,507,617  3/1985  Sasaki ..................... 375/83

FOREIGN PATENT DOCUMENTS 2101445  1/1983  United Kingdom ................ 358/320

*Primary Examiner*—James J. Groody
*Assistant Examiner*—David E. Harvey
*Attorney, Agent, or Firm*—Lewis H. Eslinger; Alvin Sinderbrand

[57] ABSTRACT

A digital data recovery circuit for recovering digital data recorded on a magnetic record medium along with still-image video signals in a frequency mulitplexed relationship employs two phase-control-loops, in which the first loop corrects absolute or DC phase errors and the second phase-control-loop corrects AC phase errors evidenced as abrupt phase shifts of the digital data signal caused by changes in rotation of the magnetic record by using a horizontal synchronization signal derived from the video signal, and in which the outputs of loop filters included in the first and second phase-control loops, respectively, are combined to provide a control signal for a voltage controlled oscillator that provides a demodulating carrier signal so that a synchronous detector can detect the digital data signal, thereby to cause the synchronous detector to lock onto even abrupt phase shifts in the carrier of the digital data signal.

18 Claims, 6 Drawing Figures

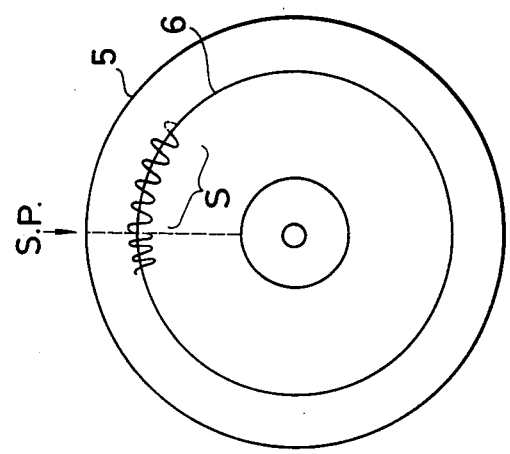
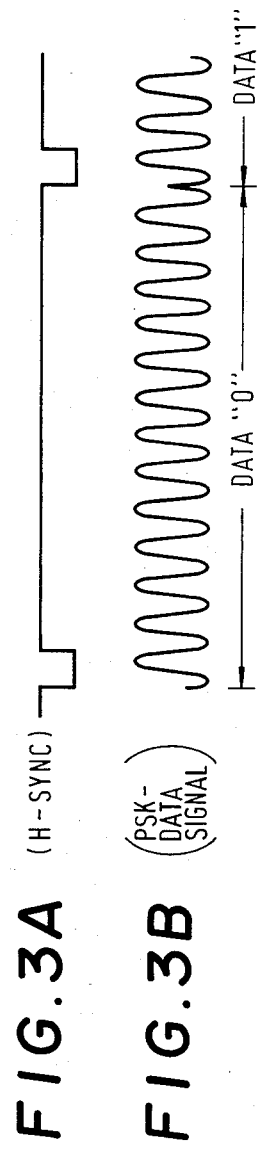

DIGITAL DATA RECOVERY CIRCUIT

BACKGROUND OF THE INVENTION

1. Field of the Invention

The present invention relates in general to a digital data recovery circuit and, specifically, to a data recovery circuit for deriving digital signals from video signals and digital control signals that are recorded by frequency multiplexing.

2. Description of the Prior Art

Cameras have been proposed that can produce still images, not by the use of conventional silver-halide photography, but by using video tape recorder technology. Such still cameras of the video recorder kind must be portable and light weight and one approach to achieving such desired capabilities is by using a solid-state image pick-up sensor and a magnetic disc to record the image information. The still video signals or image signals, as well as other relevant digital data such as the date, title, name, and the like, are recorded using frequency multiplex techniques as concentric video recording tracks on the magnetic disc. In one proposed still-image video recording scheme, the digital data is recorded in a frequency band that is different than that chosen for the video image signals, and such digital data is recorded by phase-shift-keying (PSK) modulation, which permits fewer read errors during reproduction of such digital data. In this approach, a "1" bit of the digital data signal is represented by the positive phase of a carrier signal and a "0" bit is represented by the negative phase of that carrier waveform.

In the circuit proposed for use in deriving the digital data recorded on the video magnetic disc using the above-described multiplexing technique, a continuous demodulation carrier is generated that is based on the carrier signals originally modulated by the digital data. The generated continuous carrier and the reproduced PSK-modulated signal are multiplied together following the well-known synchronous detection technique, thereby demodulating the digital data, which consists of "1" bits and "0" bits. The oscillator that is used to generate the continuous carrier signal for such demodulation is controlled by a phase-locked-loop (PLL), so that the output signal from the oscillator is phased locked onto the reproduced PSK signal.

In this approach, it is a requirement that the PSK-modulated digital data signal must be recorded at a very low signal level to prevent the video image signals and the PSK-modulated data signals from interfering with each other. The video image signals are, of course, of utmost importance. Therefore, the reproduction circuit must employ a loop filter that has a relatively long time constant, so as to reduce the adverse effects of noise on this low level signal. Because of this long time constant, the phase loop of the reproducing circuit has a poor response characteristic relative to phase variations and when there is an abrupt shift in phase of the carrier of the PSK signal, such as might occur at a switching point of a single track due to irregular rotation of the disc during recording or during playback, the output phase of the continuous carrier oscillator cannot respond to such a phase shift, and this results in errors in the data being read out.

OBJECTS AND SUMMARY OF THE INVENTION

Accordingly, it is an object of the present invention to provide a digital data recovery circuit which can eliminate the above-noted defects inherent in the prior art.

Another object of this invention is to provide a data recovery circuit for recovering digital data from a magnetic disc, wherein the response characteristic of a phase loop with respect to reproduced PSK-modulated digital data is improved, so that when an abrupt shift in phase is present a demodulation carrier is generated to respond to such abrupt phase shift, thereby providing correct demodulation.

In accordance with one aspect of the present invention, a digital data recovery circuit that derives digital signals from a recording medium on which video signals and PSK-modulated digital data signals have been recorded includes a carrier signal oscillator for performing PSK demodulation of the digital data signals. A first phase control loop in the digital data recovery circuit is also provided and has a sufficiently long time constant to reduce adverse effects caused by noise, and which controls the output phase of the carrier signal oscillator based on a phase difference between an input from the carrier signal oscillator and the carrier wave of the reproduced PSK-modulated signal. A second phase control loop is provided in the digital data recovery circuit, and this is used to control the output phase of the carrier signal oscillator based on a phase difference between the output from the carrier signal oscillator and a sync signal that is obtained from the reproduced video image signal. This digital data recovery circuit of the present invention provides a phase control loop having a significantly improved response speed over those known heretofore.

The above and other objects, features, and advantages of the present invention will become apparent from the following detailed description of illustrative embodiments thereof to be read in conjunction with the accompanying drawings, in which like reference numerals identify the same elements.

BRIEF DESCRIPTION OF THE DRAWINGS

FIGS. 3A and 3B represent waveforms of a video horizontal sync signal and a PSK-digital data signal, respectively;

FIG. 4 schematically illustrates a magnetic disc and a track with a signal waveform recorded thereon;

DETAILED DESCRIPTION OF PREFERRED EMBODIMENTS

Figure 1:
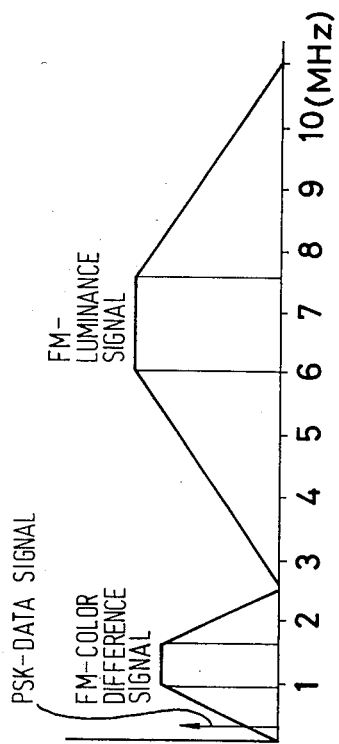
FIG. 1 represents the frequency spectrum of the signals recorded in a still-image video recorder of the kind suitable for use with the present invention.

FIG. 1 represents the frequency spectrum of the signals in a recording band of a still-image video recorder suitable for use with an embodiment of the present invention. In this recording band the luminance signals and the color-difference signals (chrominance) are frequency modulated and recorded at different respective frequency bands, as represented by their respective locations along the abscissa in FIG. 1. The digital data signals, as described above relating to titles, dates, and the like, are phase-shift keying (PSK) modulated and recorded below the frequency band of the FM color difference signals in the frequency spectrum of FIG. 1.

Figure 2:
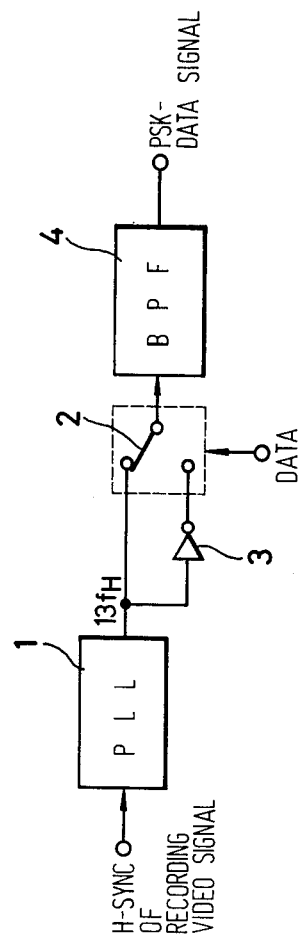
FIG. 2 is a schematic block diagram of a phase-shift keying data modulator for use in a digital data recording system.

In the phase-shift keying data modulator used in the recording system of FIG. 2, the horizontal sync signal, H-sync, of frequency $f_H$ that is derived from the video recording signal is fed to phase-locked-loop (PLL) circuit 1, which produces a carrier wave of frequency thirteen times that of the frequency of the H-sync signal, that is, $13f_H$. The waveform of the H-sync signal of the video signal is represented in FIG. 3A. The carrier signal output from phase-locked-loop circuit 1 is fed directly to one input of switch 2 and also fed through inverter 3 to another input of switch 2. The two inputs of switch 2 represent the positive and negative phases of the carrier wave, and the output of switch 2 is selectively connected to the positive or negative input in accordance with the state of the data being either "0" or "1", in order to perform PSK-modulation. The data signal to be modulated is fed into switch 2 and may be thought of as functionally controlling the movable arm of switch 2. Accordingly, a PSK data signal, the waveform of which is represented in FIG. 3B, can be formed using a circuit of the kind generally shown in FIG. 2. This PSK-modulated data signal is then superimposed on the video recording signal following suppression of its side bands by bandpass filter 4.

Thus, the PSK-modulated data output signal from the modulator of FIG. 2 has a predetermined phase relationship with the horizontal sync signal $f_H$, and the waveforms of these two signals are shown in FIGS. 3A and 3B, respectively. Such predetermined phase relationship will differ in accordance with the kind of still image video recorder being used and will depend upon the individual design specification of various manufacturers. Additionally, even within a single brand of recorder, the predetermined phase relationship can vary in response to the properties of the recording medium being used. Thus, the reproducing apparatus must perform signal processing and must assume that the horizontal sync signal in the reproduced signal and the PSK-modulated data signal do not require any specific phase relationship.

Given the frequency relationship described above in regard to FIG. 1, the luminance signals, the color difference signals, and the PSK data signals are recorded as tracks on magnetic disc 5, one of which is represented as track 6 in FIG. 4, and these tracks can be concentric or spiral. In the case when magnetic disc 5 is subject to irregular rotation, that is, when the drive thereof is not within a predetermined tolerance range, the phase of the carrier signal of the PSK data signal will change abruptly at a switching point, represented at S.P. in track 6. If the carrier signal oscillator in the PSK demodulation system of the reproducing apparatus cannot respond to these abrupt phase shifts which appear for example at switching point S.P., a read error that is manifested as a demodulation error is present in the signals reproduced from a portion of the track adjacent this phase-shift switching point. This portion of the track which will be read out in error is represented at S adjacent switching point S.P. in track 6.

Figure 5:
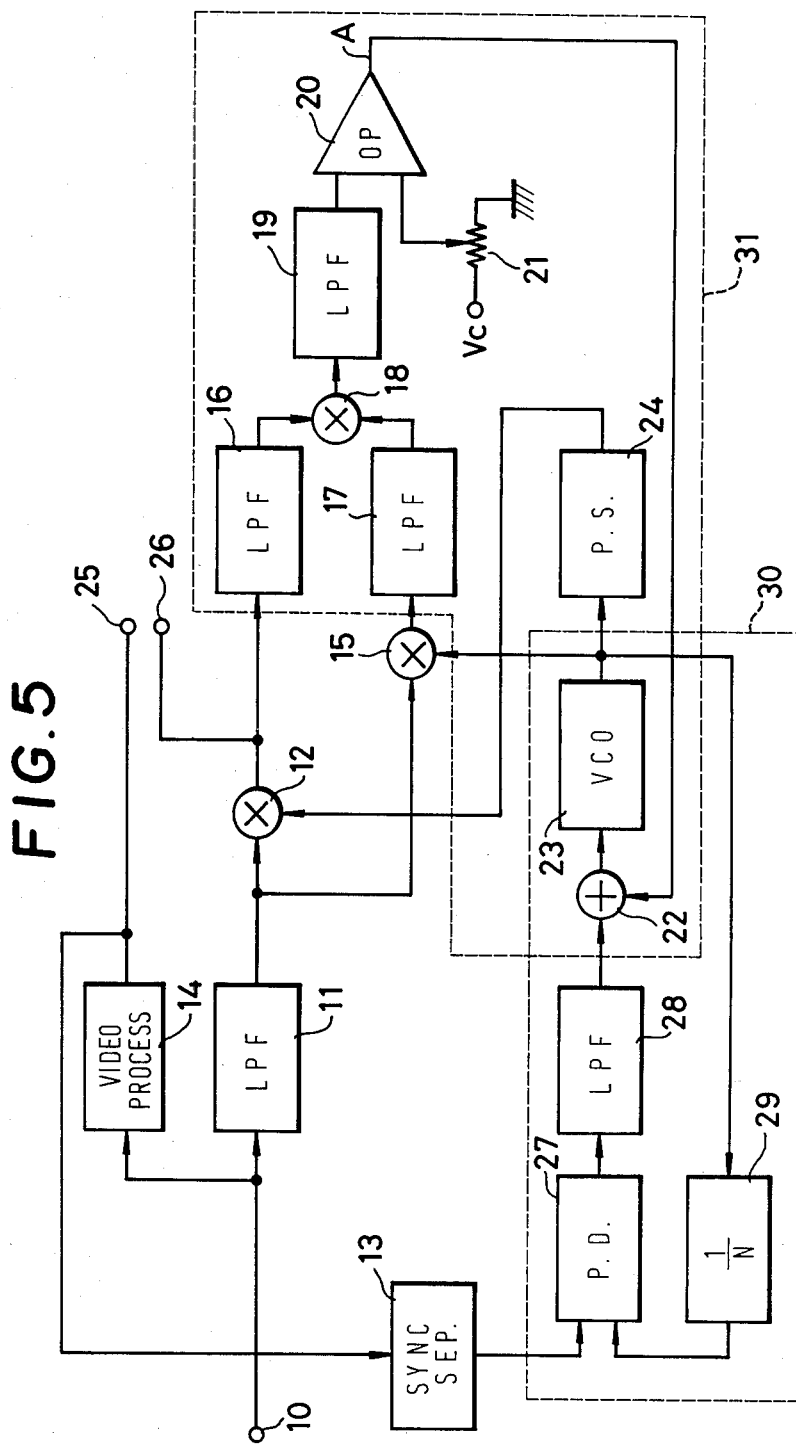
FIG. 5 is a schematic block diagram of a PSK data demodulator for use in a still-image video reproduction apparatus according to an embodiment of the present invention.

The present invention provides a reproducing circuit in which the carrier signal oscillator can respond quickly and accurately to abrupt phase shifts caused by irregularities in the rotation of the record medium, and one embodiment thereof is shown in FIG. 5. An RF signal is reproduced from the disc and fed through input terminal 10 to low-pass filter 11, which extracts a carrier wave component of the PSK data signal, for example, $13f_H=204.54$ KHZ. This extracted carrier wave component of frequency $13f_H$ is fed as an input to signal multipliers 12 and 15, respectively, which function as detectors in conjunction with a first phase-control loop 31. First phase-control loop 31 functions to lock the phase of voltage controlled oscillator (VCO) 23 with the reproduced PSK data signal. The locking of the phase in this first control loop has two stable points, at the positive and negative phases of the PSK-modulated signal, respectively. Multipliers 12 and 15 receive at respective second inputs the modulated carrier signal from VCO 23. Specifically, the carrier signal from VCO 23 is fed directly to a second input of multiplier 15, and a phase-shifted demodulation carrier signal, shifted 90° by 90°-phase shifter 24, is fed to a second input of multiplier 12. In this fashion, multipliers 12 and 15 perform synchronous detection of the input RF signal. Synchronous detection is understood to involve the insertion of a missing carrier signal in exact synchronism with the original carrier at the transmitter. When the input to the synchronous detector consists of two suppressed carrier signals in phase quadrature, as in a color television chrominance signal, the phase of the reinserted carrier can be adjusted to recover either of the signals. Thus, two synchronous detectors using carriers differing in phase by 90° can extract the in-phase and quadrature signals separately from the chrominance signal. The output of multiplier 12 is available as a demodulated digital data output signal at output terminal 26. The reproduced RF signals from the magnetic record medium fed in through input terminal 10 are also fed to video processing circuit 14, which produces a still-image video signal in the conventional fashion available at output terminal 25.

The possibility exists that the "1's" and "0's" of the detected output data can be opposite to the true values, that is, the output can be reversed in polarity, because the output signal from voltage controlled oscillator 23 can become locked with either the positive or negative phase of the input PSK modulated signal. This can be overcome when encoding in the recording system by adding a pilot bit "1" to the data stream, so that the data can always be reproduced having the correct polarity.

Whether the input signals to multiplier 12 are of the same phase or are of different phases, the resultant product is fed to multiplier 18 through low pass filter 16. Meanwhile, when there is a phase difference of 90° between the two signals input to multiplier 15, the output from multiplier 15 will be zero. Because the output signal of multiplier 15 is fed through low-pass filter 17 to signal multiplier 18, when this signal is zero the output of multiplier 18 will also become zero. The output from multiplier 18 is fed through low pass filter 19, which acts as a loop filter and thereby suppresses its noise component. The output from low pass filter 19 is fed to one input of operational amplifier 20 which has as its other input a bias potential taken off a variable resistor 21 connected between a bias voltage $V_c$ and relative ground potential. The output of operational amplifier 20 is then fed to adder 22.

The output signal from adder 22 is fed as the control signal to the input terminal of voltage controlled oscillator 23 so that the phase of the output signal of voltage control oscillator 23 is locked to a certain phase relationship with a phase of the reproduced PSK-modulated signal input to the system. When there is a phase difference established between the output of voltage controlled oscillator 23 and the input reproduced PSK signal, a phase-error output signal corresponding to this difference will be present at the output of operational amplifier 20, represented at point A in the first phase-control loop 31, thereby returning the output phase from voltage controlled oscillator 23 to the original phase.

Whether the phase of the output signal from voltage controlled oscillator 23 is locked to the positive or negative phase of the input PSK signal is indeterminate, as has been described hereinabove. Thus, irrespective of the stable phase to which the phase locked system has become locked, an equivalent phase-error output may be present at point A in the first phase-control loop 31. Nevertheless, low pass filter 19, which serves as the loop filter in the first phase control loop 31, is provided with a sufficiently long time constant so that first phase-control loop 31 will not respond to noise and thereby cause a detection error.

Because the loop filter cannot respond to a discontinuity in the phase of the reproduced PSK signal, which corresponds to switching point S.P. of track 6 shown for example in FIG. 4, a detection error will be present until first phase-control loop 31 is able to respond to such discontinuity. To solve this problem, the present invention provides a second phase-control loop 30, in which the reproduced video signal from video processor 14 is fed to sync separating circuit 13, which separates the horizontal sync signal therefrom. The separated horizontal sync signal (H-sync) is fed from sync separator 13 to phase detector 27, whose output is passed through low-pass filter 28 to the second input of signal adder 22. Phase detector 27 operates to compare the phases of the H-sync signal from sync separator 13 with an output signal from frequency divider 29, which divides the frequency of output signal of voltage controlled oscillator 23 by a number N, in this case N=13. A phase-error output signal from phase detector 27 is fed to adder 22, which adds the output from the low-pass filter 28 with the output from first phase-control loop 31. The output signal from adder 22 is then the control input voltage for voltage controlled oscillator 23.

Because the input horizontal sync signal will have a very good signal-to-noise ratio, which is typically the case in video signals, the low-pass filter 28 which functions as the loop filter of second-phase control loop 30 can be constructed as a filter having a relatively short time constant. Therefore, the control output signal to VCO 23 responds quickly to any shift in phase of the horizontal sync signal. For example, at the switching point S.P. of track 6 in FIG. 4, the phase of the horizontal sync signal will change in correspondance with the discontinuity of phase of the carrier wave of the PSK-modulated data. Thus, a demodulation carrier wave corresponding to an abrupt phase shift of the PSK-modulated data signal can be obtained by controlling the second phase control loop 30 and detection, that is, demodulation, can be performed without error.

Conversely, the loop filter of first phase-control loop 31, which is embodied as low-pass filter 19, can be permitted to have a sufficiently long time constant so that even if the recording level of the PSK data signal is reduced considerably, adverse effects of noise on the reproduction detection system are small. First phase-control loop 31 has as its principal function to correct an absolute, that is, direct current (DC) phase error, whereas second phase-control loop 30 has as its function to generate an AC phase-error correction signal, which is superimposed on the DC phase-error correction signal, and both control loops have respective loop bandwidths sufficient to perform phase correction of the demodulation carrier wave together.

Since the recording level of the recorded PSK-modulated signal is often quite low, the PSK data will not interfere with the video and chroma signals being displayed as the still video image. This then does away with the requirement for a bandpass filter having a narrow pass band for the reproduced color difference signal and, thus, the video image quality available for viewing is improved.

In a modified embodiment of that represented in FIG. 5, first phase-control loop 31 can be replaced with a phase-control loop wherein the carrier frequency of the reproduced PSK data is doubled and the phase of the voltage controlled oscillator output signal is locked to the phase of that frequency-doubled signal. In this case, the phase-control loop is locked to either the positive or negative phases of the input PSK data, and the second phase-control loop, which utilizes the reproduced horizontal sync signal as a reference signal, can be incorporated to provide substantially the same beneficial operating characteristics as obtained in the embodiment shown in FIG. 5.

Figure 6:
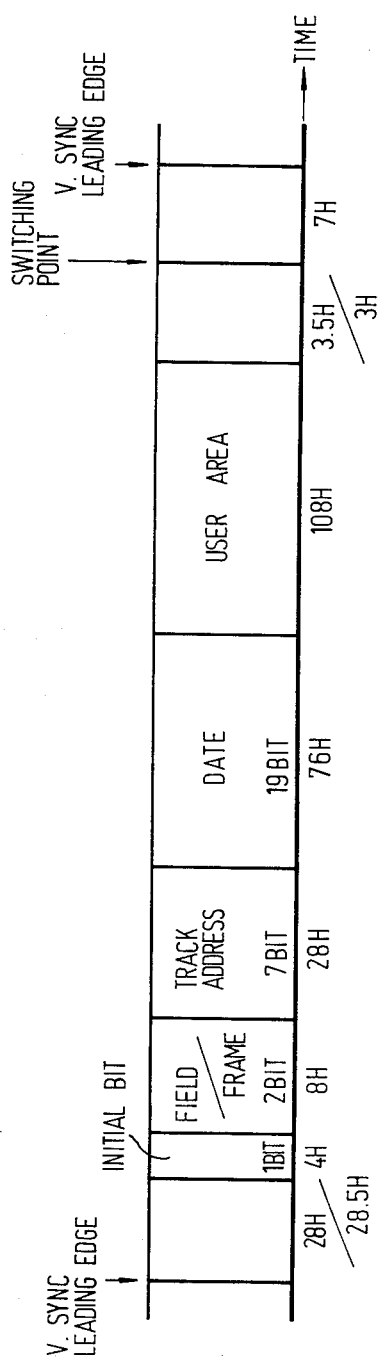
FIG. 6 represents a format chart of digital data utilized in the present invention.

FIG. 6 represents the code and bit allocations plotted against time in an example of a data multiplexed recording system adopting the differentially coherent phase-shift keying (DPSK) system, and an example of specifications for this DPSK system can be as follows. For example, in video track frequency multiplex recording, the recording level of the data signal is set to be −20±2 dB with respect to the color signals. This value is for the case wherein color signals and data signals are not modulated and, in this example, the recording frequency is 13$f_H$, which corresponds to 204.54 KHZ. The modulation system chosen is DPSK, that is, differentially coherent phase-shift keying, and the $N^{th}$ data point is expressed as the difference between the recording information at the N−1$^{th}$ bit and the $N^{th}$ bit. When the $N^{th}$ data bit equals 1, the recording information of the $N^{th}$ bit is changed with respect to the recording information of the N−1$^{th}$ bit, whereas when the $N^{th}$ data bit equals zero the recording information of the $N^{th}$ bit can be the same as the recording information of the N−1$^{th}$ bit. And as an example of this modulation system reference is had to the following:

| DATA | 1011010010 |
|---|---|
| Recording Information | 10010011100 |
| | ↑ |
| | Pilot bit (0 or 1) |

Note that the carrier and the horizontal sync signal are to be in phase, and the bit rate is chosen in this example so that four horizontal intervals (4H) correspond to one bit.

Thus, according to the present invention, and as described above, in addition to the first demodulating or detecting phase-control loop of the carrier oscillator, which serves to lock the voltage controlled oscillator output to the carrier wave phase of the PSK-modulated data, a second phase-control loop is provided which uses the horizontal sync signal obtained in the reproduced video signal as a reference signal in order to reproduce PSK modulated data recorded with the video signals in a frequency multiplex relationship. Accordingly, even if the time constant of the first phase-control loop is required to be long, for example, to overcome signal-to-noise ratio problems, the response time of the second phase-control loop at the time of a discontinuity of the phase in the reproduced PSK data can be kept short. This thereby improves detection (demodulation) performance of the PSK modulated data and, meanwhile, because the first phase-control loop has a sufficiently long time constant, the relative level of the recording PSK data can also be kept low. The PSK data and the video signals do not interfere with each other and, thus, a high quality still-image video signal can be reproduced.

Although illustrative embodiments of the present invention have been described in detail above with reference to the accompanying drawings, it is to be understood that the invention is not limited to those precise embodiments, and that various changes and modifications can be effected thereby by one skilled in the art without departing from the scope and spirit of the invention, as defined by the appended claims.

What is claimed is:

1. Apparatus for recovering digital data from a reproduced frequency-multiplexed signal in which a carrier signal modulated with digital data is in frequency-multiplexed relationship with a video signal, comprising:
    signal separating means receiving said reproduced frequency-multiplexed signal for separating therefrom said carrier signal modulated with digital data and a video horizontal synchronization signal;
    phase-control loop means cooperating with said signal separating means and receiving said carrier signal modulated with digital data for generating a continuous carrier signal in phase-locked relationship with the carrier signal modulated with said digital data, said phase-control loop means including detector means receiving said carrier signal modulated with digital data and said continuous carrier signal for deriving said digital data from said carrier signal modulated with digital data; and
    phase-compensation means receiving said video horizontal synchronization signal and responsive to said phase-control loop means for compensating said continuous carrier signal for phase shifts in said carrier signal modulated with digital data by sensing corresponding phase shifts of said video horizontal synchronization signal, whereby said detector means derives said digital data independently of said phase shifts in said carrier signal modulated with the digital data.

2. Apparatus for recovering digital data according to claim 1, in which said phase-control loop means includes a loop filter having a predetermined time constant and a voltage controlled oscillator producing said continuous carrier signal and being responsive to an output of said loop filter.

3. Apparatus for recovering digital data according to claim 2, in which said phase-compensation means includes a second loop filter having a time constant less than said predetermined time constant of said loop filter in said phase-control loop means.

4. Apparatus for recovering digital data according to claim 3, in which said phase-control loop means includes signal adder means for combining an output of said loop filter in said phase-control loop means and an output from said second loop filter in said phase-compensation means and producing a control signal fed to said voltage controlled oscillator for controlling the phase of said continuous carrier signal in response thereto.

5. Apparatus for recovering digital data according to claim 4, in which said signal separating means includes a low-pass filter receiving said reproduced frequency-multiplexed signal for passing only said carrier signal modulated with digital data.

6. Apparatus for recovering digital data according to claim 5, in which said detector means includes synchronous detector means receiving in-phase and quadrature versions of said continuous carrier signal.

7. A digital data recovery circuit for deriving digital data from a reproduced frequency-multiplexed signal consisting of a carrier modulated with said digital data in frequency-multiplexed relationship with a video signal, comprising:
    signal separating means for separating said carrier modulated with digital data and a horizontal synchronization signal contained in said video signal from said reproduced frequency-multiplexed signal;
    first phase-control means connected to said signal separating means for generating a continuous carrier signal in phase-locked relationship with said carrier modulated with digital data;
    data detecting means connected to said first phase-control means and said signal separating means for deriving said digital data from said separated carrier modulated with digital data in response to said continuous carrier signal; and
    second phase-control means connected to said first phase-control means and receiving said separated horizontal synchronization signal for adjusting said continuous carrier signal for rapid phase changes of said separated carrier modulated with digital data in response to said separated horizontal synchronization signal, whereby said data detecting means derives said digital data irrespective of said rapid phase changes.

8. A digital data recovery circuit according to claim 7, in which said first phase-control means includes a first loop filter having a predetermined time constant and a voltage controlled oscillator producing said continuous carrier signal and having the phase thereof controlled in response to an output of said first loop filter.

9. A digital data recovery circuit according to claim 8, in which said second phase-control means includes a second loop filter having an output which also controls said voltage controlled oscillator, and in which the time constant of said second loop filter is less than said predetermined time constant of said first loop filter.

10. A digital data recovery circuit according to claim 9, in which said output of said first loop filter and said output of said second loop filter are fed to an adder for producing a summed signal fed to said voltage controlled oscillator for controlling said phase of said continuous carrier signal produced thereby.

11. A digital data recovery circuit according to claim 10, in which said signal separating means includes a low-pass filter for passing only said carrier modulated with digital data.

12. A digital data recovery circuit according to claim 11, in which said detector means comprises synchronous detector means receiving in-phase and quadrature versions of said continuous carrier signal.

13. Apparatus for recovering digital data from an RF signal formed of a PSK data signal having a carrier and a color video signal in frequency multiplexed relationship, comprising:
  signal separating means receiving said RF signal for separating therefrom said PSK data signal and a video horizontal synchronization signal contained in said color video signal;
  first phase-control means connected to said signal separating means for generating a continuous carrier signal in phase-locked relationship with said carrier of said PSK data signal;
  demodulator means receiving said PSK data signal and said continuous carrier signal for demodulating a data signal from said PSK data signal; and
  second phase-control means receiving said video horizontal synchronization signal and connected with said first phase-control means for adjusting the phase of said continuous carrier signal in response to abrupt phase shifts of said video horizontal synchronization signal, whereby said demodulating of a data signal is effected without influence of said abrupt phase shifts.

14. Apparatus for recovering digital data according to claim 13, in which said first phase-control means includes a first loop filter having a predetermined time constant and a voltage controlled oscillator, and said second phase-control means includes a second loop filter having a time constant shorter than said predetermined time constant of said first loop filter, and in which said voltage controlled oscillator is controlled by both said first and second phase-control means.

15. Apparatus for recovering digital data according to claim 14, in which said demodulator means includes synchronous detector means receiving in-phase and quadrature versions of said continuous carrier signal from said first phase-control means.

16. Apparatus for recovering digital data according to claim 15, in which an output signal of said first loop filter and an output signal of said second loop filter are fed to a signal adder for producing a summed signal fed to said voltage controlled oscillator for controlling the oscillation phase of said continuous carrier signal.

17. Apparatus for recovering digital data according to claim 15, in which said first phase-control means includes frequency doubler means for doubling the frequency of said carrier of the PSK data signal and said continuous carrier signal is phase-locked to said carrier of doubled frequency.

18. Apparatus for recovering digital data according to claim 15, in which said signal separating means comprises a low-pass filter passing only signals of frequency at and below the frequency of said carrier of said PSK data signal.

* * * * *